(12) United States Patent
Kawashita et al.

(10) Patent No.: US 11,197,379 B2
(45) Date of Patent: Dec. 7, 2021

(54) METHOD FOR PRODUCING PRINTED WIRING BOARD

(71) Applicant: MITSUBISHI GAS CHEMICAL COMPANY, INC., Tokyo (JP)

(72) Inventors: Kazuaki Kawashita, Yamagata (JP); Takaaki Ogashiwa, Yamagata (JP); Syunsuke Hirano, Yamagata (JP); Yoshihiro Kato, Yamagata (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 176 days.

(21) Appl. No.: 16/495,259

(22) PCT Filed: Mar. 29, 2018

(86) PCT No.: PCT/JP2018/013312
§ 371 (c)(1),
(2) Date: Sep. 18, 2019

(87) PCT Pub. No.: WO2018/181742
PCT Pub. Date: Oct. 4, 2018

(65) Prior Publication Data
US 2020/0015363 A1    Jan. 9, 2020

(30) Foreign Application Priority Data

Mar. 31, 2017   (JP) .............................. JP2017-070722

(51) Int. Cl.
*H05K 3/42*    (2006.01)
*H05K 3/00*    (2006.01)
*H05K 3/46*    (2006.01)

(52) U.S. Cl.
CPC .......... *H05K 3/427* (2013.01); *H05K 3/0026* (2013.01); *H05K 3/4605* (2013.01); *H05K 3/4632* (2013.01)

(58) Field of Classification Search
CPC .. H05K 3/0036; H05K 3/427; H05K 3/46–05; H05K 3/4632
See application file for complete search history.

(56) References Cited

U.S. PATENT DOCUMENTS

| | | | |
|---|---|---|---|
| 4,642,160 A * | 2/1987 | Burgess | H05K 3/0035 216/18 |
| 6,548,767 B1 * | 4/2003 | Lee | H05K 1/115 174/255 |

(Continued)

FOREIGN PATENT DOCUMENTS

| | | |
|---|---|---|
| CN | 104602446 A | 5/2015 |
| JP | 9-148698 | 6/1997 |

(Continued)

OTHER PUBLICATIONS

Official Communication issued in International Bureau of WIPO Patent Application No. PCT/JP2018/013312, dated Jun. 26, 2018.

*Primary Examiner* — Carl J Arbes
(74) *Attorney, Agent, or Firm* — Greenblum & Bernstein P.L.C.

(57) ABSTRACT

The method for producing a printed wiring board according to the present invention with use of a metal-clad laminated sheet including a metal foil laminated on each of both surfaces of an insulating resin base material, the method at least including: a step (1) of irradiating a predetermined position in a surface (A) of the metal-clad laminated sheet with a laser to provide a via hole leading to the metal foil in a surface opposite to the surface (A); and a step (2) of irradiating a predetermined position in a surface (B), located in the opposite side to the surface (A), of the metal-clad laminated sheet with a laser to provide a via hole leading to the metal foil in a surface opposite to the surface (B).

9 Claims, 4 Drawing Sheets

(56) References Cited

U.S. PATENT DOCUMENTS

| | | | | |
|---|---|---|---|---|
| 6,631,558 | B2 * | 10/2003 | Burgess | B23K 26/0853 |
| | | | | 205/125 |
| 6,972,382 | B2 * | 12/2005 | Zollo | H05K 3/4623 |
| | | | | 174/262 |
| 7,402,758 | B2 * | 7/2008 | Mattix | H05K 1/115 |
| | | | | 174/262 |
| 7,698,813 | B2 * | 4/2010 | Wang | C23C 18/1603 |
| | | | | 29/852 |
| 2001/0020548 | A1 * | 9/2001 | Burgess | B23K 26/389 |
| | | | | 174/262 |
| 2006/0102384 | A1 | 5/2006 | Watanabe et al. | |
| 2008/0257591 | A1 | 10/2008 | Ikeda | |
| 2015/0114698 | A1 | 4/2015 | Tsu-Wei et al. | |

FOREIGN PATENT DOCUMENTS

| | | | |
|---|---|---|---|
| JP | 2000-077568 | A | 3/2000 |
| JP | 2004-152935 | | 5/2004 |
| JP | 2004-281437 | A * | 10/2004 |
| JP | 2007-227512 | | 9/2007 |
| JP | 2010-258062 | | 11/2010 |
| JP | 2014-216406 | | 11/2014 |
| JP | 2016-035969 | | 3/2016 |
| WO | 88/04877 | * | 6/1988 |
| WO | 2006/046510 | | 5/2006 |
| WO | 2015/186712 | | 12/2015 |

* cited by examiner

METHOD FOR PRODUCING PRINTED WIRING BOARD

TECHNICAL FIELD

The present invention relates to a method for producing a printed wiring board.

BACKGROUND ART

Electronic devices with smaller size and higher performance have been developed in recent years, and printed wiring boards to be mounted in such electronic devices are required to have higher density such as lowering of wiring density (lines/spaces) and downsizing of solder pads.

Conventional printed wiring boards are formed through a process including: providing an insulating resin base material having a conductor circuit in one surface or each surface with openings as through-holes or via holes, and providing the openings with a conductor layer through electroless plating or electroplating to connect the circuit on one surface to the circuit on the other surface via the conductor layer (e.g., Patent Documents 1 and 2). In conventional via hole processing, drilling is performed for only one surface.

Patent Document 3 describes a method for producing a core substrate for a multilayer laminated wiring board including a copper foil on each of the face and the back of an insulating resin layer, the method including: a step of forming a copper foil pattern on the face of the core substrate and a copper foil pattern on the back of the core substrate by etching the copper foils on the face and back of the core substrate; a step of forming a connection hole to connect the copper foil patterns on the face and back of the core substrate together by removing the insulating resin layer exposed through the step of forming copper foil patterns; and a step of removing a resin residue and a copper residue generated in a bottom of the connection hole through the step of forming a connection hole, wherein a laser is used as a means to remove the insulating resin layer in the step of forming a connection hole, desmear treatment is used as a means to remove the resin residue, and spray washing is used as a means to remove the copper residue.

CITATION LIST

Patent Document

Patent Document 1: International Publication No. WO 2006/46510A1
Patent Document 2: Japanese Patent Laid-Open No. 2007-227512
Patent Document 3: Japanese Patent Laid-Open No. 2014-216406

SUMMARY OF INVENTION

Technical Problem

When a larger number of through-holes are provided to increase packaging density, however, the printed wiring board has lower strength and cannot endure during mounting. Through-holes have a disadvantage of difficulty in achievement of higher density because of the large hole diameter (top diameter).

In common via hole processing, if a larger number of via holes are provided, the printed wiring board is subjected to a stress and warped, which disadvantageously makes the printed wiring board unavailable as a substrate.

Moreover, in drilling with a laser, there is a problem with removal of smear residues (residues of an insulating resin base material and residues of copper) present in the bottom of a via hole. While spray washing is typically performed as a means to remove smear residues, such spray washing is so powerful that a copper foil is disadvantageously broken during removal of smears or the via hole is fractured. In view of these, the production method described in Patent Document 3 enables removal of smear residues without breaking any copper foil through preformation of copper foil patterns; however, the problem of generation of a fracture from a via hole is not solved at all since the production method includes spray removal. In particular, if drilling is performed for both an insulating resin base material and metal foils as in the present invention, via holes with a bottom thickness smaller than that in the case of the core substrate described in Patent Document 3 are provided, which complicates removal of smears with spray washing, and hence production of a printed wiring board for the purpose of imparting smaller size and higher performance to electronic devices is difficult.

The present invention has been made in view of such problems, and an object of the present invention is to provide a method for producing a printed wiring board which enables formation of a mounted substrate having superior mechanical strength and higher density.

Solution to Problem

The present inventors have diligently examined in order to solve the above problems. As a result, the present inventors have found that the problems can be solved by providing not only one surface but also the other surface with via holes, completing the present invention.

[1] A method for producing a printed wiring board with use of a metal-clad laminated sheet comprising a metal foil laminated on one surface of an insulating resin base material and a metal foil laminated on the other surface, the method at least comprising:

a step (1) of irradiating a predetermined position in a surface (A) of the metal-clad laminated sheet with a laser to provide a via hole leading to the metal foil in a surface opposite to the surface (A); and a step (2) of irradiating a predetermined position in a surface (B), located in the opposite side to the surface (A), of the metal-clad laminated sheet with a laser to provide a via hole leading to the metal foil in a surface opposite to the surface (B).

[2] The method for producing the printed wiring board according to [1], wherein the steps (1) and (2) are performed simultaneously or sequentially.

[3] The method for producing the printed wiring board according to [1] or [2], wherein the metal is copper.

[4] The method for producing the printed wiring board according to any one of [1] to [3], wherein a top diameter of at least one of the via holes provided in the steps (1) and (2) is 120 μm or smaller.

[5] The method for producing the printed wiring board according to any one of [1] to [4], wherein at least one pitch between the via holes provided in the steps (1) and (2) is 60 to 400 μm.

[6] The method for producing the printed wiring board according to any one of [1] to [5], wherein each of the lasers is a carbon dioxide laser.

[7] The method for producing the printed wiring board according to [6], wherein a pulse width of each of the lasers is 100 μsec or shorter.

[8] The method for producing the printed wiring board according to [6] or [7], wherein a total amount of energy of each of the lasers per via hole is 0.1 to 20 mJ.

[9] The method for producing the printed wiring board according to any one of [6] to [8], wherein number of shots of each of the lasers per via hole is one to five.

[10] The method for producing the printed wiring board according to any one of [1] to [9], wherein a thickness of the insulating resin base material is 10 to 100 μm.

[11] The method for producing the printed wiring board according to any one of [1] to [10], wherein thicknesses of the metal foils on both the surfaces are 1 to 18 μm.

[12] The method for producing the printed wiring board according to any one of [1] to [11], wherein a total number of the via holes provided in the steps (1) and (2) is 5,000,000 holes/$m^2$ or more.

Advantageous Effects of Invention

The present invention can provide a method for producing a printed wiring board which enables formation of a mounted substrate having superior mechanical strength and higher density.

DESCRIPTION OF EMBODIMENTS

[Printed Wiring Board]

The printed wiring board in the present embodiment is formed with use of a metal-clad laminated sheet including a metal foil laminated on each of both surfaces of an insulating resin base material. The printed wiring board may be a laminate of metal-clad laminated sheets.

The printed wiring board may include a protective layer including a resin sheet on a metal foil in one surface or on each surface.

[Metal-Clad Laminated Sheet]

The metal-clad laminated sheet according to the present embodiment will be described. The metal-clad laminated sheet includes a metal foil laminated on each of both surfaces of an insulating resin base material.

The insulating resin base material is not particularly limited, and typically includes a thermosetting resin, an inorganic filler, and, as necessary, a glass cloth. The thickness of the insulating resin base material is not particularly limited, and typically 10 to 100 μm, preferably 15 to 100 μm for easy handling of the base material. According to the present embodiment, warping does not take place even when a thin insulating resin base material is used, residual smears present in the bottom of a via hole do not cause any problem, and many via holes and through-holes can be provided at desired positions with high precision.

The thermosetting resin to be used in the present invention may be any non-halogen compound of thermosetting resin to be used for materials of printed wiring boards. Specific examples of such thermosetting resin include non-halogen compounds such as cyanate compounds, epoxy resin, maleimide compounds, polyimide resin, and double bond-added polyphenylene ether resin, and one of them or a combination of two or more of them can be used. Preferred thermosetting resins are, for example, a cyanate compound (a) and epoxy resin (b).

The cyanate compound (a) to be preferably used in the present invention may be any non-halogen compound having two or more cyanate groups in one molecule. Specific examples of the cyanate compound (a) include bisphenol A-based cyanate compounds, phenol novolac-based cyanate compounds, bisphenol E-based cyanate compounds, naphthalene skeleton-containing cyanate compounds, and biphenyl skeleton-containing cyanate compounds, and one of them or a combination of two or more of them can be used. More preferred are, for example, 2,2-bis(4-cyanatophenyl) propane, bis(3,5-dimethyl-4-cyanatophenyl)methane, phenol novolac-based cyanate compounds, and naphtholaralkyl-based cyanate compounds.

The epoxy resin (b) to be preferably used in the present invention may be any non-halogen compound having two or more epoxy groups in one molecule. Specific examples of the epoxy resin (b) include bisphenol A-based epoxy resin, bisphenol F-based epoxy resin, biphenol-based epoxy resin, phenol novolac-based epoxy resin, cresol novolac-based epoxy resin, polyfunctional phenol-based epoxy resin, naphthalene skeleton-containing epoxy resin, biphenyl skeleton-containing epoxy resin, and phosphorous-containing epoxy resin, and one of them or a combination of two or more of them can be used. More preferred are, for example, bisphenol A-based epoxy resin, phenol novoilac-based epoxy resin, biphenylaralkyl-based epoxy resin, naphthalene-based epoxy resin, naphtholaralkyl-based epoxy resin, and trifunctional phenol-based epoxy resin.

Examples of applicable inorganic fillers include silica, boron nitride, wollastonite, talc, kaolin, clay, mica, alumina, zirconia, titania, metal oxides such as magnesium oxide, nitrides, silicides, and borides. Addition of an inorganic filler to the insulating resin substrate can reduce the thermal expansion coefficient of a laminated sheet for printed wiring boards and enhance the rigidity thereof. In particular, addition of an inorganic filler with a low dielectric constant such as silica and boron nitride can reduce the dielectric constant of an insulating resin substrate.

Examples of the metal foils include copper, gold, and aluminum. Preferably, each of the metal foils is copper for electric conductivity. The thicknesses of the metal foils are not particularly limited, and typically 1 to 18 μm, preferably 1 to 12 µm for ease of laser drilling. The film thickness in one surface may be identical to or different from that in the other surface; however, these film thicknesses are preferably identical to each other. According to the present embodiment, warping does not take place even when thin metal foils are used, residual smears present in the bottom of a via hole do not cause any problem, and many via holes and through-holes can be provided at desired positions with high precision.

[Method for Producing Printed Wiring Board]

Next, the method for producing a printed wiring board in the present embodiment will be described with reference to Examples.

Figure 1:
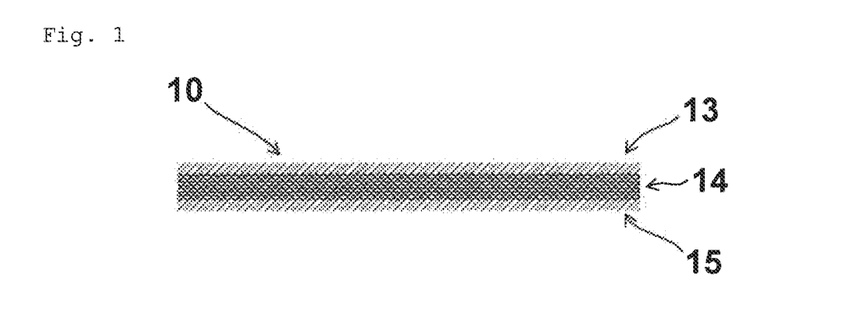
FIG. 1 shows a cross-sectional view of a metal-clad laminated sheet in the present embodiment, the metal-clad laminated sheet including a metal foil laminated on each of both surfaces of an insulating resin base material.

FIG. 1 shows a cross-sectional view of a copper-clad laminated sheet, before via hole processing, to be used in the method for producing a printed wiring board in the present embodiment.

In the production method in the present embodiment, it is preferred to perform roughening treatment for copper foils 13 and 15 on a double-sided copper-clad laminated sheet 10 through black oxidation treatment before via hole processing. Examples of roughening treatment methods include methods using BO-220 (product name) produced by Mac-Dermid Performance Solutions Japan K.K.

Figure 2:
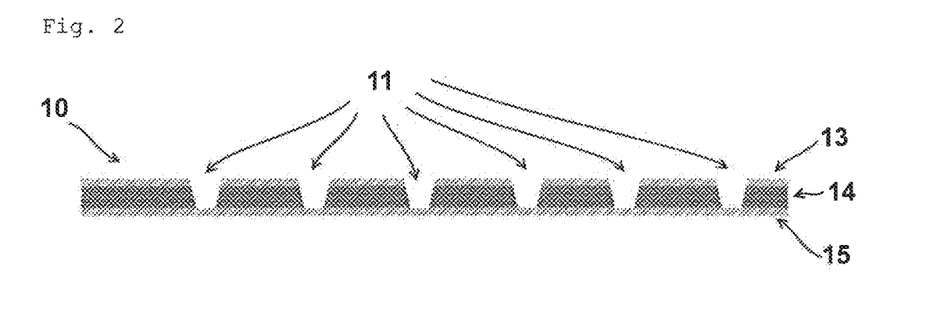
FIG. 2 shows a cross-sectional view of a metal-clad laminated sheet obtained through a step (1) of providing a via hole in the present embodiment.

In producing a printed wiring board, via hole processing to expose the insulating resin base material 14 and the copper foil 13 is performed in order to electrically connect wiring to be formed on one layer and wiring to be formed on the other layer together. As illustrated in FIG. 2 (step (1)), at predetermined positions in one surface of the double-sided copper-clad laminated sheet 10, via holes 11 which penetrate the copper foil 13 in one side and the insulating resin base material 14 and lead to the copper foil 15, located in the opposite surface, are formed. In the step (1), that is, hole processing is performed so as not to penetrate the copper foil 15 while the copper foil 13 and the base material 14 are removed. The predetermined positions refer to appropriate positions along a circuit pattern.

In the step (1), any through-hole may be provided, unless the through-hole deteriorates the advantageous effects of the present embodiment. A through-hole is a hole penetrating the copper foil 13, the insulating resin base material 14, and the copper foil 15.

Figure 3:
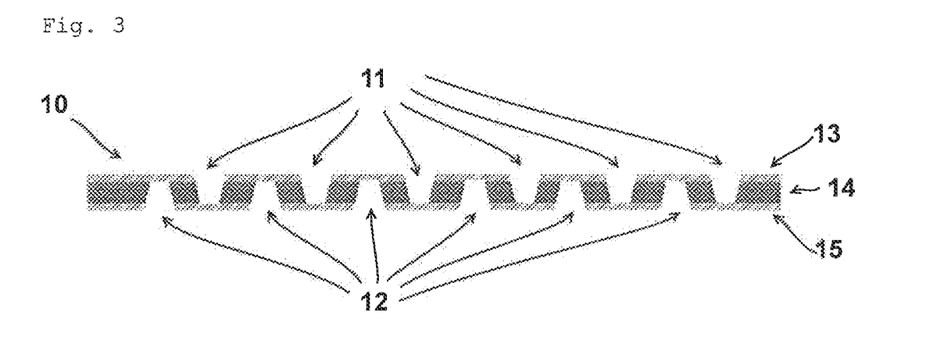
FIG. 3 shows a cross-sectional view of a metal-clad laminated sheet obtained through steps (1) and (2) of providing a via hole in the present embodiment.

In the step (2), as illustrated in FIG. 3, via holes 12 which penetrate the copper foil 15 and the insulating resin base material 14 and lead to the copper foil 13, located in the opposite surface to the copper foil 15, are formed at predetermined positions in the opposite surface to the surface processed in the step (1) (copper foil 15). A via hole formed in the step (2) may be integrated with a via hole formed in the step (1) into a through-hole penetrating therethrough, unless the through-hole deteriorates the advantageous effects of the present embodiment. Alternatively, a through-hole may be provided in the step (2) without integrating with a via hole formed in the step (1) into a through-hole penetrating therethrough, unless the through-hole deteriorates the advantageous effects of the present embodiment.

In the present embodiment, via holes can be provided on both the face and back of the metal foil laminated sheet by processing the metal foils and the insulating resin base material at once. According to the present embodiment, via holes can be formed even without a step of forming a copper foil pattern in advance, because laser processing is performed with high energy. In addition, residual smears present in the bottom of a via hole do not cause any problem, warping does not take place even when the printed wiring board is thin, and many via holes and through-holes can be provided at desired positions with high precision.

The steps (1) and (2) may be performed simultaneously or sequentially. If these steps are simultaneously performed, the warping of the substrate is advantageously more reduced. If these steps are sequentially performed, an existing laser processor can be used for processing, and thus processing is easy. The steps (1) and (2) may be repeatedly performed to produce the printed wiring board according to the present embodiment.

In the present embodiment, it is preferred to perform the steps (1) and (2) while the object to be processed (metal foil laminated sheet) is subjected to vacuum suction, because warping does not take place even when the printed wiring board is thin and a mounted substrate having higher density can be obtained. Vacuum suction is performed, for example, by using a plate with holes of ϕ2.5 mm at a 15-mm pitch to suck up through reduction of pressure. The degree of vacuum is not particularly limited, and typically −100000 to −100 Pa (negative pressure).

(Top Diameter)

The top diameters of the via holes provided in the steps (1) and (2) are not particularly limited and may be different from or identical to each other. In the present embodiment, at least one or more of the top diameters are preferably 120 µm or smaller, and more preferably 30 to 100 µm, for reduction of voids in filled plating. More preferably, the top diameters of the via holes are all 30 to 100 µm. The top diameters are preferably homogeneous because a mounted substrate having superior mechanical strength and higher density can be obtained in a preferred manner. The top diameter of a via hole refers to the outer diameter at the nearest position to laser irradiation.

The shapes of the via holes may be identical to or different from each other; however, the shapes may be identical to each other and circular because a mounted substrate having superior mechanical strength and higher density can be obtained in a preferred manner.

(Pitches)

The pitches between the via holes provided in the steps (1) and (2) are not particularly limited, and may be different from or identical to each other. In the present embodiment, at least one or more of the pitches is of 60 to 400 µm or smaller, and more preferably of 100 to 400 µm for reliability. More preferably, all the pitches between the via holes are of 200 to 400 µm. A pitch refers to the shortest distance from the center of gravity of the surface of a via hole or through-hole to the center of gravity of the surface of an adjacent via hole or through-hole. That is, a pitch between via holes is the shortest distance between adjacent via holes or through-holes.

(Number of Via Holes)

The total number of the via holes provided in the steps (1) and (2) is not particularly limited, but preferably 5,000,000 holes/m$^2$ or more, and more preferably 10,000,000 to 40,000,000 holes/m$^2$ because warping is significantly reduced. The upper limit is not particularly limited; however, the case that the number of the via holes exceeds 40,000,000 holes/m$^2$ is not preferred because suction failure tends to be caused to generate the warping of the printed wiring board, even with vacuum suction. According to the production method of the present invention, the warping of the printed wiring board does not take place, and a mounted substrate having superior mechanical strength, including many via holes, and having higher density can be obtained.

[Method for Via Hole Processing]

Via hole processing can be performed by using a mechanical drill or a laser such as an ultraviolet laser (UV laser) and a carbon dioxide laser ($CO_2$ laser), and is not particularly limited thereto. In the present embodiment, use of a $CO_2$ laser is preferred because it allows processing to precisely form holes of small diameter and is also superior in terms of processing speed and cost.

It is preferred to perform desmear treatment to remove resin residues remaining on the side walls of the via holes formed. This desmear treatment is performed with wet treatment such as chemical solution treatment using an acid or an antioxidant (e.g., chromic acid, permanganic acid), or dry treatment such as oxygen plasma discharge treatment, corona discharge treatment, ultraviolet laser treatment, and excimer laser treatment.

A suitable desmear treatment method is selected from these methods, with consideration of the expected amount of residues for desmear depending on processing conditions including the type and thickness of the insulating resin base material, the opening diameters of the via holes, and conditions for laser irradiation.

($CO_2$ Laser)

In the present embodiment, use of a $CO_2$ laser is preferred because desired via holes can be formed in a preferred manner by appropriately specifying the wavelength, pulse width, total amount of energy, and number of shots of the $CO_2$ laser. In particular, the $CO_2$ laser is suitable in the case that the thickness of the insulating resin base material (14) is 100 µm or smaller.

(Wavelength of $CO_2$ Laser)

The wavelength of the $CO_2$ laser is 9 to 11 µm.

(Pulse Width)

Figure 8:
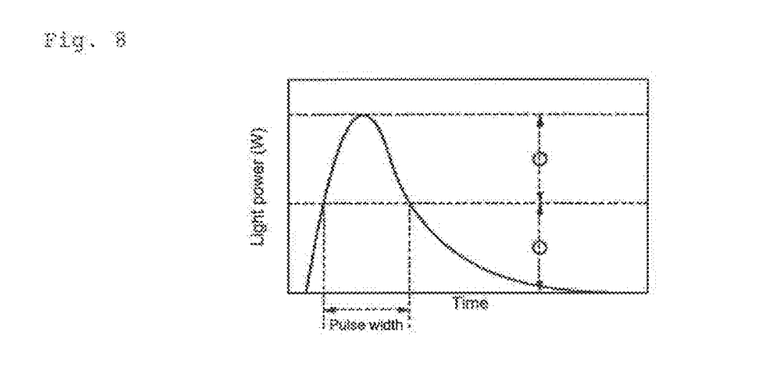
FIG. 8 shows a schematic graph for a single pulse laser, where the horizontal axis represents time and the vertical axis represents light power.

The pulse width of the $CO_2$ laser in via hole processing methods in the case that the thickness of the insulating resin base material is 100 µm or smaller is not particularly limited, but preferably 100 µsec or shorter, and more preferably 1 to 15 µsec from the viewpoint of hole shape. As illustrated in FIG. 8, the pulse width in the present embodiment is defined as a full width at half maximum of a curve for a single pulse laser. The pulse width, which has a dimension of time, is a temporal width indicating duration of light output.

(Total Amount of Energy)

The total amount of energy of the $CO_2$ laser per via hole in via hole processing methods in the case that the thickness of the insulating resin base material is 100 µm or smaller is not particularly limited, but preferably 0.1 to 20 mJ, and more preferably 0.5 to 15 mJ from the viewpoint of hole shape. If the total amount of energy of the $CO_2$ laser is smaller than 0.1 mJ, preferred via holes cannot be formed by processing, and smear residues cannot be removed in a preferred manner, and thus such situation is not preferred. If the total amount of energy of the $CO_2$ laser is larger than 20 mJ, large warping is caused to the printed wiring board, and thus such situation is not preferred. In particular, the $CO_2$ laser with the total amount of energy within the above range leaves a reduced amount of smear residues after laser processing, and hence the warping of the printed wiring board does not take place, and smear residues can be easily removed in desmear treatment. The total amount of energy of a laser, the detail of which will be described later in (Processing method), corresponds to the total amount of energy input to the printed wiring substrate in one laser drilling.

(Number of Shots)

The number of shots of the $CO_2$ laser per via hole in via hole processing methods in the case that the thickness of the insulating resin base material is 100 µm or smaller is not particularly limited, but preferably one to five, and more preferably one to three for economic efficiency and processing time. The number of shots will be described in (Processing method) below.

(Processing Method)

Examples of via hole processing methods include trepanning and punching.

Trepanning is a processing method to drill by inputting energy along a contour of a hole of a certain shape. In processing by trepanning, a contour of a hole of a certain shape is cut out. Trepanning is preferably used in processing to form a hole larger than a beam diameter.

In trepanning, the number of shots per round refers to the number of irradiations of the printed wiring board with a single pulse laser during a round of scanning in processing to form a single hole by trepanning.

The number of rounds in trepanning refers to the number of rounds of scanning along a contour of a hole in processing to form a single hole by trepanning.

Punching is a processing method to irradiate one position multiple times with a pulse laser in an overlapping manner. In particular, punching is used in processing to form a deep hole.

In punching, the number of shots refers to the number of pulse lasers with which the printed wiring board is irradiated in processing to form a single hole by punching.

The total amount of energy corresponds to the total amount of energy input to the printed wiring board in one laser drilling.

The total amount of energy in processing by trepanning can be calculated from the following expression under the above conditions.

Total amount of energy=pulse energy×number of rounds×number of shots per round

The total amount of energy in processing by punching can be calculated from the following expression under the above conditions.

Total amount of energy=pulse energy×number of shots

Pulse energy is the energy of a single pulse laser. Pulse energy corresponds to a value calculated by integrating the light power of a single pulse laser with respect to time. With the same pulse energy, as the pulse width is shorter, the light peak power is higher to facilitate formation of a deep hole by processing.

In the present embodiment, pulse frequency is the number of single pulse lasers shot per unit time.

(Step of Plating)

To electrically connect two surfaces together by filling the via holes by plating in the present embodiment, it is desirable to fill the via holes by plating with an electroplating method such as a sparger plating method, in which, first, the inner walls of the via holes are subjected to common electroless plating treatment to form an electroless plating layer, and a jet flow of plating solution is impinged on the substrate.

For the electroless plating or electroplating, plating with metal such as copper, tin, silver, various solders, copper/tin, and copper/silver is preferred, and electroless copper plating and copper electroplating are more preferred.

In the present embodiment, it is desirable that conductor circuits to be formed on two surfaces of the insulating resin base material be formed through etching treatment of conductor layers (metal foils) formed simultaneously with formation of the via holes or through-holes filled by plating.

In this step of forming conductor circuits, first, a photosensitive dry film resist is pasted on the surface of each of the conductor layers, and then subjected to light exposure along the predetermined circuit pattern followed by development treatment to form an etching resist, and a portion of each conductor layer without the etching resist formed is etched to form a conductor circuit pattern including an electrode pad.

For the etching solution in the treatment step, at least one aqueous solution selected from aqueous solutions of sulfuric acid-hydrogen peroxide, persulfate, cupric chloride, and ferric chloride can be used.

As a pre-treatment for formation of conductor circuits by etching the conductor layers, the whole surface of each conductor layer can be etched in advance to reduce the thickness to about 1 to 10 μm, more preferably to about 2 to 8 μm, for ease in forming a fine pattern.

The printed wiring board according to the present embodiment can be used to form a multilayer printed wiring board. In a multilayer printed wiring board, for example, the printed wiring board according to the present embodiment is included as a core substrate, and a build-up wiring layer is formed on the core substrate, the build-up wiring layer including conductor layers (metal foils) and resin insulating layers (insulating resin base materials) alternately formed by a conventional method.

In such a multilayer printed wiring board, it is desirable to allow a part of the outermost conductor layer to serve as a pad for bump connection with predetermined pitches so that each pitch between adjacent via holes or through-holes formed in the core substrate and filled by plating becomes the same pitch as the pad for bump connection.

Example

Hereinafter, Example using the method for producing a printed wiring board in the present embodiment and Comparative Example will be described with reference to FIGS. 1 to 7. However, the method for producing a printed wiring board in the present embodiment should not be interpreted as being limited to the contents described in Example.

Example

As illustrated in FIG. 1, a double-sided copper-clad laminated sheet 10 (produced by MITSUBISHI GAS CHEMICAL COMPANY, INC., CCL(R)-HL832NSF type LC-E 0.06 mmt D/D) was used as a starting material. The thickness of the insulating resin base material 14 was 60 μm and the thicknesses of the copper foils 13 and 15 were each 5 μm.

Next, the copper foils 13 and 15 in the double-sided copper-clad laminated sheet 10 were roughened through black oxidation treatment.

The double-sided copper-clad laminated sheet 10 was set on a vacuum sucker including a plate with holes of φ2.5 mm at a 15-mm pitch (under vacuum). Thereafter, predetermined positions on one surface of the double-sided copper-clad laminated sheet 10 were irradiated with a carbon dioxide laser to form via holes 11 penetrating the copper foil 13 and the insulating resin base material 14 and leading to the copper foil 15, located in the opposite surface to the copper foil 13 (see FIG. 2).

Figure 4:
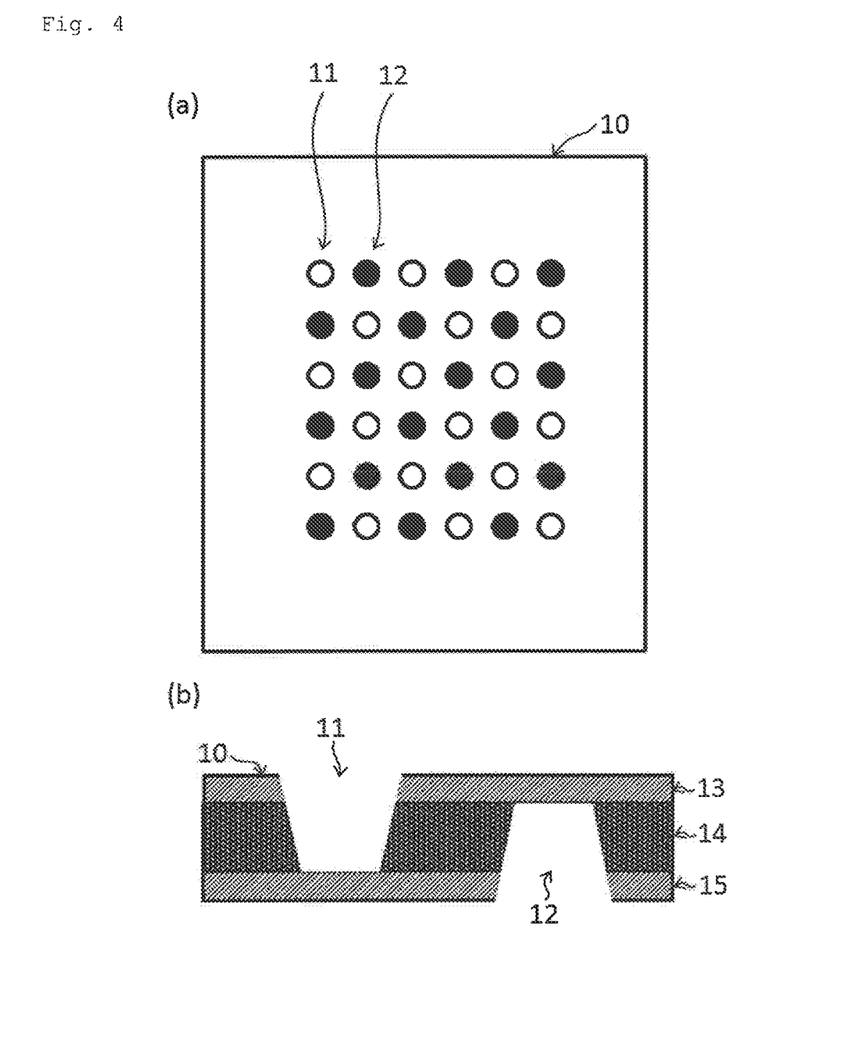
FIG. 4 shows a schematic planar view (a) and schematic cross-sectional view (b) of a printed wiring board obtained through a production method in Example 1.

Subsequently, predetermined positions on the opposite surface to the copper foil 13 (copper foil 15) were irradiated with a carbon dioxide laser (wavelength: 9 to 11 μm) to form via holes 12 penetrating the copper foil 15 and the insulating resin base material 14 and leading to the copper foil 13, located in the opposite surface to the copper foil 15 (see FIGS. 3 and 4).

In the via hole formation, a laser drilling system (ML605GTW3(-H) 5200U (product name)), produced by Mitsubishi Electric Corporation, was used. The laser processing performed was under the following conditions.

Pulse width: 6 μs, total energy of laser per via hole: 5.1 mJ, number of shots of laser per via hole: 1

The top diameter of each via hole was 75 μm. The pitches between the via holes were all 150 to 200 μm. In summary, 8,918,972 holes/m of via holes 11 and 8,918,972 holes/m$^2$ of via holes 12, thus 17,837,944 holes/m$^2$ of via holes in total were formed on a 514 mm×409 mm double-sided copper-clad laminated sheet with pitches of 150 to 200 μm.

Figure 5:
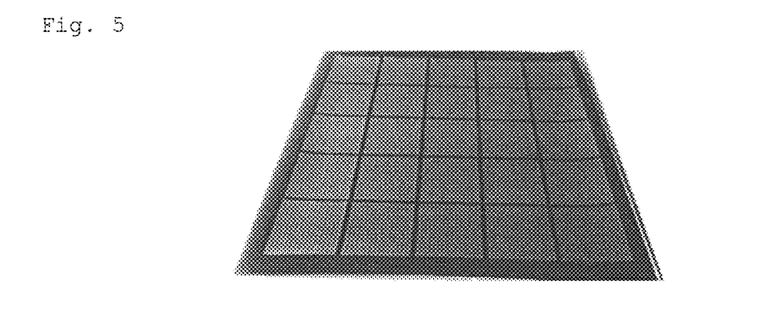
FIG. 5 shows a photograph of a printed wiring board obtained through a production method in Example 1.

The double-sided copper-clad laminated sheet after the laser processing was placed on a flat surface, and the distance between the laminated sheet and the flat surface was measured at the most distant portion from the flat surface with a rule to be 2 mm (see FIG. 5).

Comparative Example

Figure 6:
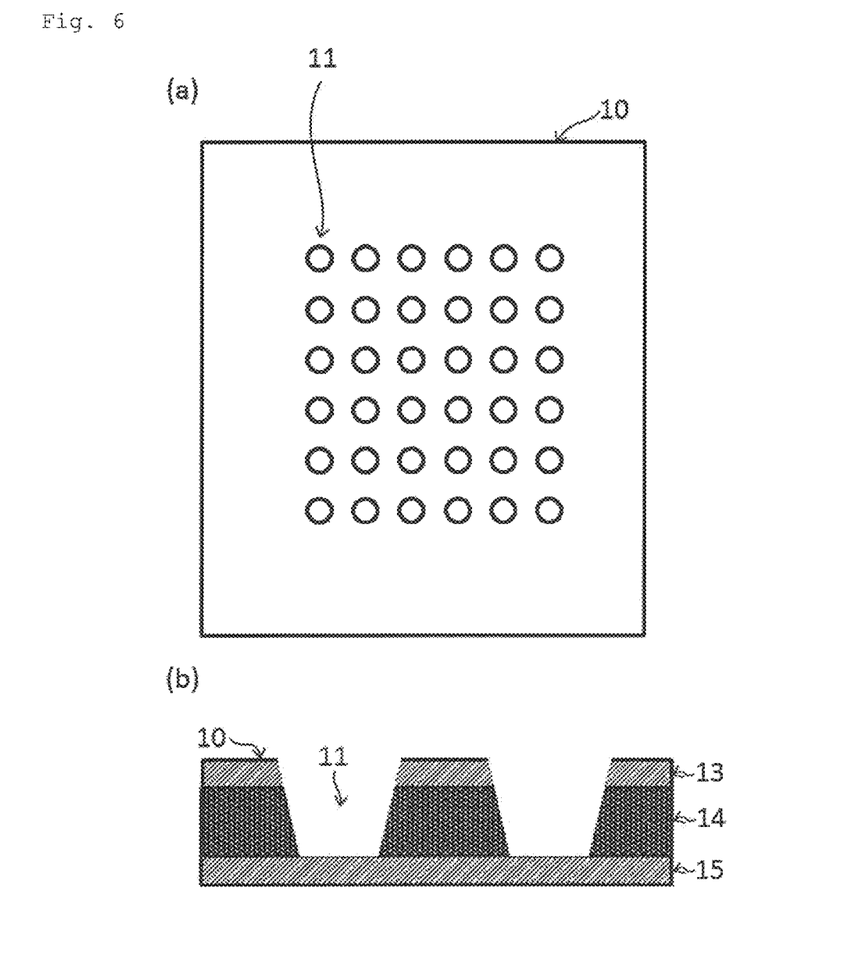
FIG. 6 shows a schematic planar view (a) and schematic cross-sectional view (b) of a printed wiring board obtained through a production method in Comparative Example 1.

By performing the laser processing of Example not separately for each surface to be processed, but only for one surface, 3,750,000 holes/m$^2$ of via holes 11 were formed (see FIG. 6).

Figure 7:
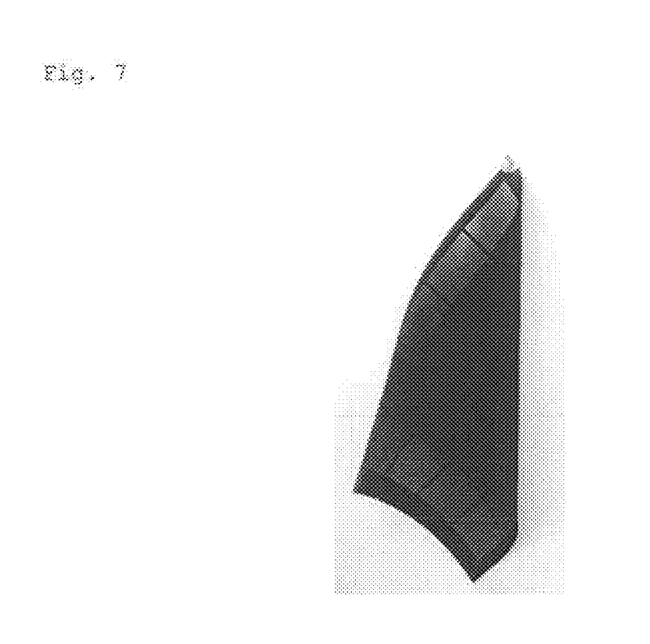
FIG. 7 shows a photograph of a printed wiring board obtained through a production method in Comparative Example 1.

The double-sided copper-clad laminated sheet after the laser processing was placed on a flat surface, and the distance between laminated sheet and the flat surface was measured at the most distant portion from the flat surface with a rule to be 25 mm (see FIG. 7).

In laser processing, edges of the surface irradiated with the laser were warped in the lifting direction. However, the method for producing a printed wiring board according to the present embodiment is inferred to have allowed such warping to be cancelled, resulting in the decreased warping.

The present application is based on a Japanese patent application filed on Mar. 31, 2017 (Japanese Patent Application No. 2017-070722), the contents of which are incorporated herein by reference.

INDUSTRIAL APPLICABILITY

The method for producing a printed wiring board according to the present invention enables formation of a mounted substrate having superior mechanical strength and higher density, and hence is extremely useful in an industrial sense. By using a printed wiring board obtained with the production method according to the present invention, demands of smaller size and higher performance for electronic devices can be satisfied.

REFERENCE SIGNS LIST

10: Double-sided copper-clad laminated sheet
11: Via holes formed by processing for one surface
12: Via holes formed by processing for the other surface (opposite surface to copper foil 11)
13: Copper foil
14: Insulating resin base material
15: Copper foil

The invention claimed is:

1. A method for producing a printed wiring board with use of a metal-clad laminated sheet comprising a metal foil laminated on each of both surfaces of an insulating resin base material, the method comprising:
   (1) irradiating predetermined positions in a surface (A) of the metal-clad laminated sheet with a first laser to provide a plurality of first via holes leading to the metal foil in a surface opposite to the surface (A); and
   (2) irradiating predetermined positions in a surface (B), located in the opposite side to the surface (A), of the metal-clad laminated sheet with a second laser to provide a plurality of second via holes leading to the metal foil in a surface opposite to the surface (B);

wherein each of the first and second lasers is a carbon dioxide laser;

wherein a total amount of energy of each of the first and second lasers per via hole is 0.1 to 20 mJ; and wherein after (1) and (2), the metal-clad laminated sheet has 5,000,000 holes/m$^2$ or more of the pluralities of first and second via holes.

2. The method for producing the printed wiring board according to claim 1, wherein (1) and (2) are performed simultaneously or sequentially.

3. The method for producing the printed wiring board according to claim 1, wherein the metal is copper.

4. The method for producing the printed wiring board according to claim 1, wherein a top diameter of at least one of the pluralities of first and second via holes is 120 μm or smaller.

5. The method for producing the printed wiring board according to claim 1, wherein at least one of the pluralities of first via holes or second via holes has a pitch of 60 to 400 μm.

6. The method for producing the printed wiring board according to claim 1, wherein a pulse width of each of the first and second lasers is 100 μsec or shorter.

7. The method for producing the printed wiring board according to claim 1, wherein number of shots of each of the first and second lasers per via hole is one to five.

8. The method for producing the printed wiring board according to claim 1, wherein a thickness of the insulating resin base material is 10 to 100 μm.

9. The method for producing the printed wiring board according to claim 1, wherein thicknesses of the metal foils on both the surfaces are 1 to 18 μm.

* * * * *